United States Patent
El Sabbagh et al.

(10) Patent No.: US 11,290,068 B2
(45) Date of Patent: Mar. 29, 2022

(54) MINIATURIZED WIDEBAND ACTIVE BALUN WITH CONTROLLABLE EQUALIZATION

(71) Applicant: NXP B.V., Eindhoven (NL)

(72) Inventors: Mahmoud Mohamed Amin El Sabbagh, San Jose, CA (US); Daniel Meeks, Austin, TX (US)

(73) Assignee: NXP B.V., Eindhoven (NL)

( * ) Notice: Subject to any disclaimer, the term of this patent is extended or adjusted under 35 U.S.C. 154(b) by 30 days.

(21) Appl. No.: 16/831,114

(22) Filed: Mar. 26, 2020

(65) Prior Publication Data

US 2021/0305947 A1 Sep. 30, 2021

(51) Int. Cl.
*H03F 9/06* (2006.01)
*H03F 3/195* (2006.01)
*H03F 3/26* (2006.01)
*H03F 3/45* (2006.01)
*H04L 25/03* (2006.01)
*H03F 3/193* (2006.01)

(52) U.S. Cl.
CPC ............ *H03F 3/195* (2013.01); *H03F 3/193* (2013.01); *H03F 3/265* (2013.01); *H03F 3/45654* (2013.01); *H04L 25/03885* (2013.01); *H03F 2200/294* (2013.01)

(58) Field of Classification Search
CPC .......................... H03F 2200/06; H03F 2200/09
USPC .......................................... 330/116, 117, 301
See application file for complete search history.

(56) References Cited

U.S. PATENT DOCUMENTS

| | | | |
|---|---|---|---|
| 6,683,510 B1 | 1/2004 | Padilla | |
| 6,990,357 B2 * | 1/2006 | Ella | H04B 1/18 |
| | | | 455/553.1 |
| 9,503,053 B1 | 11/2016 | Kim et al. | |
| 9,887,719 B2 * | 2/2018 | Pullela | H04B 1/16 |
| 9,949,361 B1 | 4/2018 | Vaisman | |
| 10,818,996 B1 * | 10/2020 | Podell | H03H 7/48 |
| 2019/0296944 A1 * | 9/2019 | Shiraishi | H04L 7/0045 |
| 2019/0386629 A1 * | 12/2019 | Taniguchi | H03H 7/42 |
| 2020/0343614 A1 * | 10/2020 | Chakraborty | H01P 5/10 |
| 2021/0194451 A1 * | 6/2021 | Lin | H01P 5/10 |

FOREIGN PATENT DOCUMENTS

EP 2814113 A1 12/2014

OTHER PUBLICATIONS

Chakraborty, Sudipta et al. "A Folded Edge-coupled Transformer Balun in GaAs with Excellent Balance from 9 to 20 GHz", Proceedings of the 48th European Microwave Conference, Sep. 25-27, 2018, pp. 1101-1104.
Pantoli, L. et al. "An Ultra-Wideband Monolitic Active Balun", IEEE 2018, 3 pgs.

* cited by examiner

*Primary Examiner* — Henry Choe

(57) ABSTRACT

Embodiments of active baluns are disclosed. In an embodiment, an active balun includes input terminals configured to receive a single-ended input signal and a linear redriver configured to transform the single-ended input signal into a differential output signal.

21 Claims, 8 Drawing Sheets

MINIATURIZED WIDEBAND ACTIVE BALUN WITH CONTROLLABLE EQUALIZATION

BACKGROUND

A balun, which can also be referred to as a balun transformer, transforms between unbalanced signals (e.g., single-ended signals) and balanced signals (e.g., differential signals). Baluns are frequently used in wireless communication devices (e.g., from mobile devices to radar devices) in which antennas use single-ended signals and other circuits use differential signals to convert between single-ended signals and differential signals. For example, baluns can be used between antennas, analog-to-digital converters (ADC), and RF front-ends to convert between single-ended signals and differential signals. A key challenge in balun design is the size and the operating bandwidth. As frequency decreases toward direct current (DC), the size or dimensions of a passive balun, which does not require an external source of electrical power for operation, may increase proportionally to the largest operating frequency wavelength and can be prohibitively large for an intended application. For example, because of size constraints, a passive balun may not be an acceptable solution for phased array antennas. Moreover, losses associated with a large balun may prohibit the balun from being used effectively in applications that are sensitive down to a fraction of a dB of insertion loss. Also, latency of a large balun can be a detrimental factor for system performance Additionally, typical baluns are band-limited, e.g., 0.5 GHz-2 GHz, or 2.0 GHz-4 GHz, and so on. Therefore, there is a need for a balun that is compact in size and wide in operating bandwidth.

SUMMARY

Embodiments of active baluns are disclosed. In an embodiment, an active balun includes input terminals configured to receive a single-ended input signal and a linear redriver configured to transform the single-ended input signal into a differential output signal. Other embodiments are also described.

In an embodiment, the input terminals include a first input terminal electrically connected to a decoupling capacitor that is connected to ground and a second input terminal electrically connected to an electrical wire that carries the single-ended input signal.

In an embodiment, the linear redriver includes a Continuous Time Linear Equalizer (CTLE) circuit configured to perform signal equalization on the single-ended input signal with different gain settings.

In an embodiment, the differential output signal includes output signal components that have a phase difference of one hundred eighty degrees.

In an embodiment, the size of the active balun is independent of a wavelength of an operating frequency of the active balun.

In an embodiment, an active balun includes a linear redriver configured to transform a single-ended input signal into a differential output signal. The linear redriver includes input terminals configured to receive the single-ended input signal, a CTLE circuit configured to perform signal equalization on the single-ended input signal a transmitter driver configured to generate a driver signal in response to the signal equalization, and output terminals configured to output the differential output signal in response to the driver signal.

In an embodiment, the input terminals include a first input terminal electrically connected to a decoupling capacitor that is connected to ground and a second input terminal electrically connected to an electrical wire that carries the single-ended input signal.

In an embodiment, the CTLE circuit is further configured to perform the signal equalization on the single-ended input signal with different gain settings.

In an embodiment, the output terminals are electrically connected to transmission paths along which output signal components of the differential output signal propagate.

In an embodiment, the output signal components of the differential output signal have a phase difference of one hundred eighty degrees.

In an embodiment, the size of the active balun is independent of a wavelength of an operating frequency of the active balun.

In an embodiment, the linear redriver further includes a receiver termination unit electrically connected to the input terminals and to a supply voltage.

In an embodiment, the linear redriver further includes an input buffer electrically connected between the receiver termination unit and the CTLE circuit.

In an embodiment, the linear redriver further includes a transmitter termination unit electrically connected to the output terminals and to the supply voltage.

In an embodiment, the linear redriver further includes an output buffer connected between the CTLE circuit and the transmitter driver.

In an embodiment, a multi-channel active balun includes multiple sets of input terminals configured to receive single-ended input signals and a multi-channel linear redriver configured to transform the single-ended input signals into differential output signals. Each of the sets of input terminals includes a first input terminal electrically connected to a decoupling capacitor that is connected to ground and a second input terminal electrically connected to an electrical wire that carries one of the single-ended input signals.

In an embodiment, each of the differential output signals includes two output signal components that have a phase difference of one hundred eighty degrees.

In an embodiment, the size of the multi-channel active balun is independent of a wavelength of an operating frequency of the multi-channel active balun.

In an embodiment, the multi-channel linear redriver includes a CTLE circuit configured to perform signal equalization on the single-ended input signals with different gain settings, a transmitter driver configured to generate a driver signal in response to the signal equalization, and output terminals configured to output the differential output signals in response to the driver signal.

In an embodiment, the multi-channel linear redriver further includes a receiver termination unit electrically connected to the sets of input terminals and to a supply voltage and a transmitter termination unit electrically connected to the output terminals and to the supply voltage.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
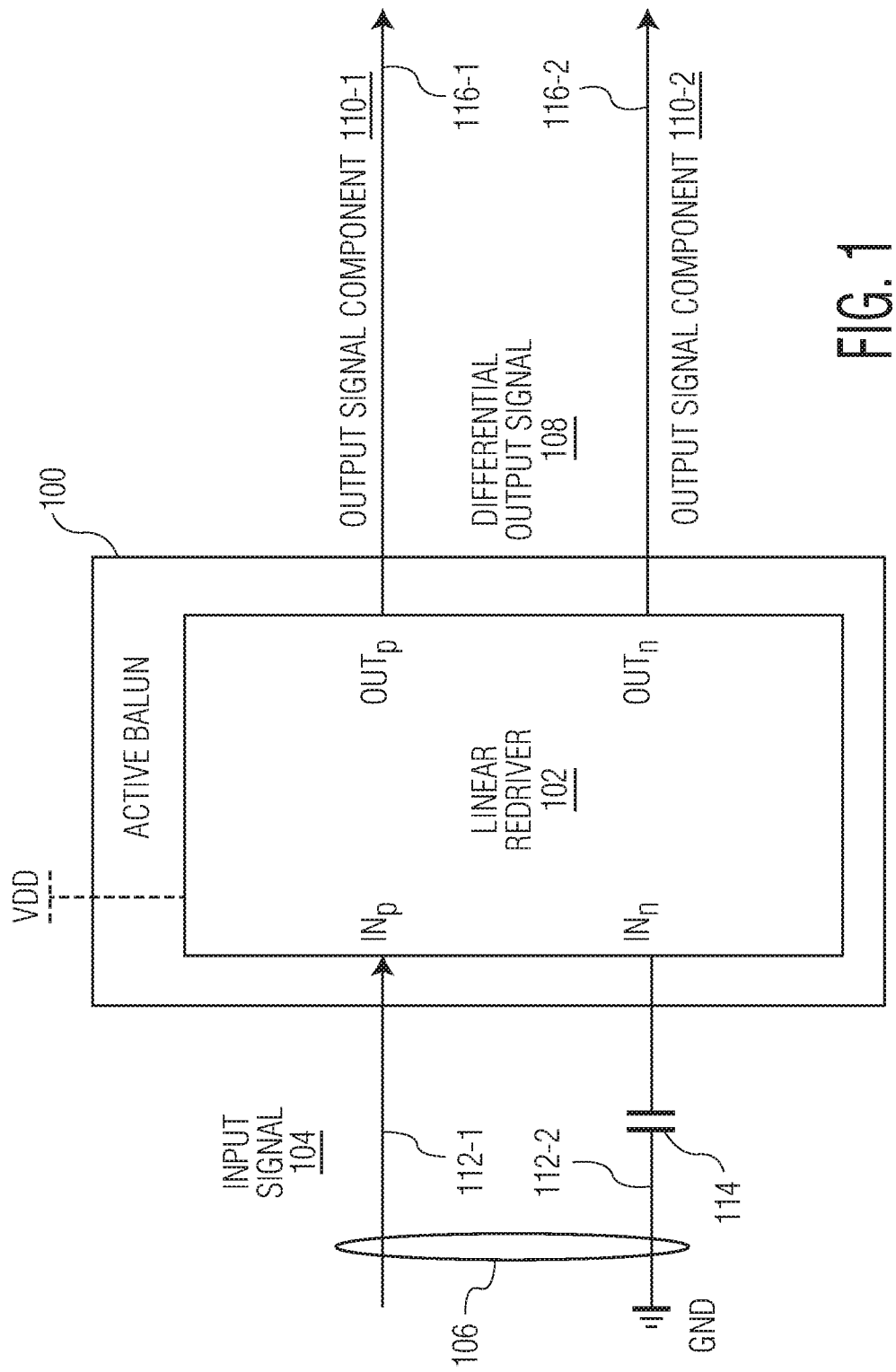
FIG. 1 depicts a balun in accordance with an embodiment of the invention.

FIG. 1 depicts an active balun 100 in accordance with an embodiment of the invention. The active balun can be used to transform between unbalanced signals (e.g., single-ended signals) and balanced signals (e.g., differential signals). For example, the active balun can be used to transform a single-ended input signal, which is, for example, received from an antenna, into a differential output signal, which can be applied to other signal processing components. The active balun can be used in various applications, such as automotive applications, communications applications, industrial applications, medical applications, computer applications, and/or consumer or appliance applications. In the embodiment depicted in FIG. 1, the active balun is implemented as a linear redriver 102 that converts or splits an input signal 104 supplied over a two-wire transmission line 106 into a differential output signal 108 having separate output signal components 110-1, 110-2. The two-wire transmission line includes one electrical wire or cable 112-1 that carries the input signal, which is received at a positive input terminal, $IN_p$, of the linear redriver that electrically connects to the electrical wire 112-1, and another electrical wire or cable 112-2 that is electrically connected to a negative input terminal, $IN_n$, of the linear redriver and to electrical ground through a decoupling capacitor 114. Consequently, the two-wire transmission line as well as the input signal can be seen as unbalanced with respect to ground. The output signal components 110-1, 110-2 of the differential output signal propagate along separate transmission paths 116-1, 116-2, respectively, which are electrically connected to output terminals, $OUT_p$, $OUT_n$ of the linear redriver, and are equal in power but out of phase by one hundred and eighty degrees. The transmission paths and the signal components of the differential signal can be seen as balanced with respect to electrical ground. The active balun depicted in FIG. 1 can operate under a DC supply voltage, $V_{DD}$, of the linear redriver or other external source of electrical power. Using the linear redriver, the active balun depicted in FIG. 1 can transform single-ended input signals to differential output signals with integrated equalization gains to compensate for high-frequency losses.

Figure 2:
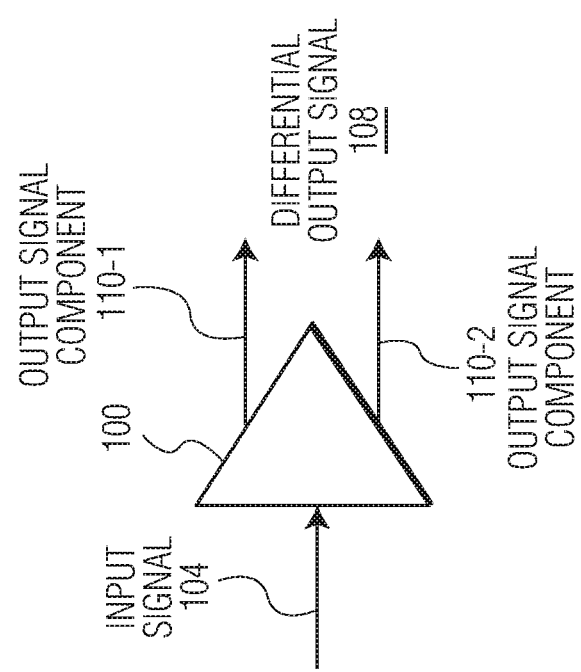
FIG. 2 depicted a simplified diagram of the active balun depicted in FIG. 1.

FIG. 2 depicted a simplified diagram of the active balun 100 depicted in FIG. 1. In the diagram depicted in FIG. 2, the active balun 100 transforms the single-ended input signal 104 into the differential output signal 108 having the separate output signal components 110-1, 110-2 that are equal in power but out of phase by one hundred and eighty degrees. Because the active balun depicted in FIGS. 1 and 2 is implemented as the linear redriver 102, the active balun can operate under a wide range of operating frequencies, for example, from DC to RF frequencies. As depicted in FIG. 1, the negative input terminal, $IN_n$, of the linear redriver 102 is short circuit to ground through the decoupling capacitor 114 to avoid affecting the termination voltage of the positive input terminal, $IN_p$, of the linear redriver. The proper termination of the linear redriver ensure a tightly controlled phase difference (i.e., phase delta) between inverted and non-inverted output signal components 110-1, 110-2 of the differential output signal 108. The signal loss on the substrate or electrical cables or wires within the linear redriver can be compensated through an equalization unit integrated within the linear redriver. Compared to a passive balun, which does not require an external source of electrical power for operation, the active balun depicted in FIGS. 1 and 2 has a smaller size. As input signal frequency decreases toward DC, the size or dimensions of a passive balun may increases proportional to the largest operating frequency wavelength and can be prohibitively large for an intended application.

For example, the size of a passive balun may be around one quarter of the operating frequency wavelength. However, the size of the active balun depicted in FIGS. 1 and 2 is independent of the wavelength of the operating frequency. For example, the IC package size of the active balun may be fixed (e.g., 2 millimeter by 6 millimeter or other fixed size). Consequently, the active balun depicted in FIGS. 1 and 2 can be used with phased array antennas or in applications that are sensitive down to a fraction of a dB of insertion loss. In addition, because of the compact size of the linear redriver, the time delay between the input terminals, $IN_p$, $IN_n$, and the output terminals, $OUT_p$, $OUT_n$ of the active balun depicted in FIGS. 1 and 2 can be a fraction of the time delay of a typical balun. Consequently, the active balun depicted in FIGS. 1 and 2 is well suited for applications such as mobile, radar, and beamforming 5G applications, which typically benefit from faster system response.

Figure 3:
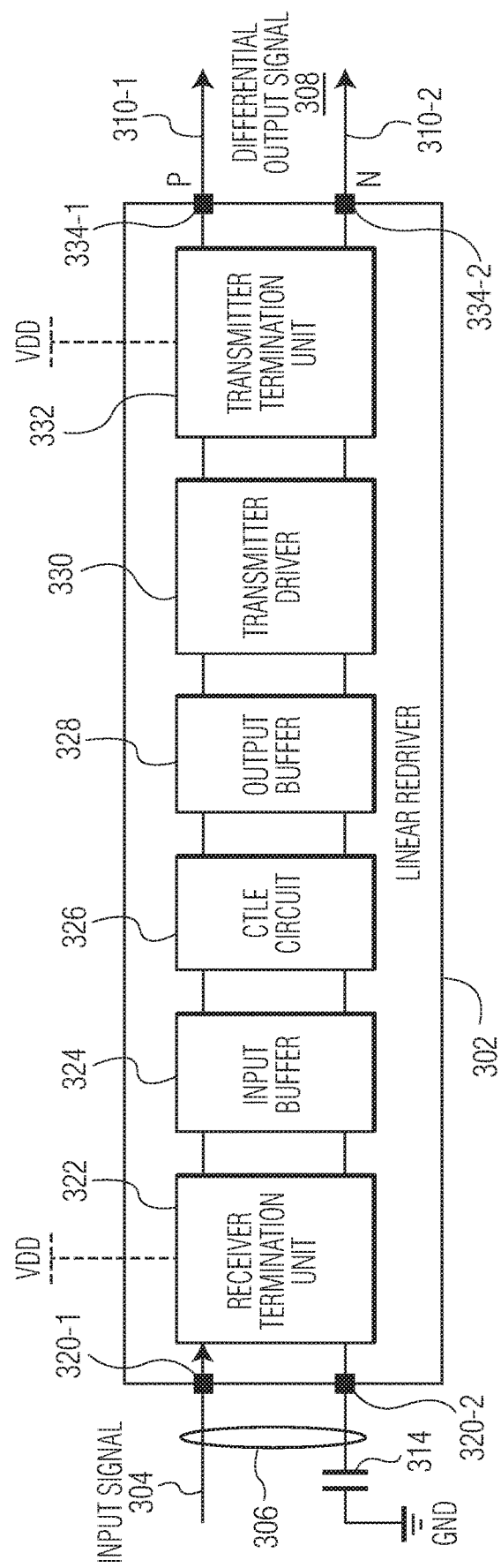
FIG. 3 is a schematic block diagram of a linear redriver that can be used in the balun depicted in FIG. 1 in accordance with an embodiment of the invention.

FIG. 3 is a schematic block diagram of a linear redriver 302 in accordance with an embodiment of the invention. The linear redriver 302 depicted in FIG. 3 is an embodiment of the linear redriver 102 depicted in FIG. 1. However, the linear redriver 102 depicted in FIG. 1 is not limited to the embodiment shown in FIG. 3. The linear redriver can be used to provide signal amplification and/or waveform shaping such that a transmitted signal behaves as intended over long channels. For example, the linear redriver can reduce insertion loss and/or to address other signal integrity challenge. In the embodiment depicted in FIG. 3, the linear redriver includes a receiver termination unit 322, an input buffer 324, a Continuous Time Linear Equalizer (CTLE) 326, an output buffer 328, a transmitter driver 330, and a transmitter termination unit 332. In the embodiment depicted in FIG. 3, the linear redriver is electrically connected to a decoupling capacitor 314, which is connected to a reference voltage such as ground (GND). In some embodiments, at least some of the components of the linear redriver are implemented in a substrate, such as a semiconductor wafer or a printed circuit board (PCB). In an embodiment, at least some of the components of the linear redriver are packaged as a stand-alone semiconductor IC chip. In the embodiment depicted in FIG. 3, the linear redriver converts or splits an input signal 304 supplied over a two-wire transmission line 306 into a differential output signal 308 having separate output signal components 310-1, 310-2 that propagate along separate transmission paths and are equal in power but out of phase by one hundred and eighty degrees. The linear redriver can match the incoming waveform of the input signal 304 with the outgoing waveform of the differential output signal 308. The linear redriver depicted in FIG. 3 can transform single-ended input signals to differential output signals with integrated equalization gains to compensate for high-frequency losses. Although the linear redriver is shown in FIG. 3 as including certain circuit elements, in other embodiments, the linear redriver may include less or more circuit element(s) from the circuit elements shown in FIG. 3.

In the embodiment depicted in FIG. 3, the receiver termination unit 322 is electrically connected to input terminals 320-1, 320-2 of the linear redriver 302, which are embodiments of the positive input terminal, $IN_p$, and the negative input terminal, $IN_n$, of the linear redriver 102 depicted in FIG. 1, and a DC supply voltage, $V_{DD}$, of the linear redriver. The receiver termination unit may include one or more resistors, inductors and/or one or more switches electrically connected to the input terminals of the linear redriver and to the DC supply voltage, $V_{DD}$, of the linear redriver. In some embodiments, the receiver termination unit includes one or more processors, such as digital state machines, microcontrollers or CPUs configured to control a switch or switches within the receiver termination unit.

In the embodiment depicted in FIG. 3, the input buffer 324 is configured to buffer the input signal 304. The input buffer can be implemented using known architectures. In some embodiments, the input buffer does not add time delay to input signal 304.

In the embodiment depicted in FIG. 3, the CTLE circuit 326 is configured to perform signal equalization on the input signal 304. The CTLE circuit can be implemented using known architectures. In some embodiments, the CTLE circuit includes multiple amplifiers with different gains. For example, the CTLE circuit may include an amplifier with a low frequency gain and an amplifier with a peaking gain to shape the required alternating current (AC) response or equalization.

In the embodiment depicted in FIG. 3, the output buffer 328 is configured to buffer the output from the CTLE circuit 326. The output buffer can be implemented using known architectures. In some embodiments, the output buffer does not add time delay to the travelling input signal 304.

In the embodiment depicted in FIG. 3, the transmitter driver 330 is configured to generate a driver signal in response to the signal equalization performed by the CTLE circuit 326. The transmitter driver may be implemented by one or more transistors or switches, such as PNP transistors, PMOS transistors, NPN transistors, and/or NMOS transistors.

In the embodiment depicted in FIG. 3, the transmitter termination unit 332 is electrically connected to the transmitter driver 330, to output terminals 334-1, 334-2 of the linear redriver 302 configured to output the differential output signal 308 in response to the driver signal from the transmitter driver 330, and to the DC supply voltage, $V_{DD}$, of the linear redriver or other supply voltage. The output terminals 334-1, 334-2 are electrically connected to transmission paths along which the output signal components 310-1, 310-2 of the differential output signal 308 propagate. The transmitter termination unit may include one or more resistors, inductors and/or one or more switches electrically connected to the output terminals of the linear redriver and to the DC supply voltage, $V_{DD}$, of the linear redriver. In some embodiments, the transmitter termination unit includes one or more processors, such as digital state machines, microcontrollers or CPUs configured to control a switch or switches within the transmitter termination unit.

The linear redriver 302 depicted in FIG. 3 can operate under a wide range of operating frequencies, for example, from DC to RF frequencies. As depicted in FIG. 3, the input terminal 320-2 of the linear redriver is connected to electrical ground through the decoupling capacitor 314. Consequently, the termination voltage of the input terminal 320-1 of the linear redriver is not affected by the voltage fluctuation at the input terminal 320-2. The proper termination of the input terminals 320-1, 320-2 of the linear redriver ensures a tightly controlled phase difference (i.e., phase delta) between inverted and non-inverted output signal components 310-1, 310-2 of the differential output signal 308. The high-frequency signal loss on the substrate or electrical cables or wires within the linear redriver can be compensated through the CTLE 326 integrated within the linear redriver. Compared to a passive balun, the linear redriver depicted in FIG. 3 has a smaller size. As input signal frequency decreases toward DC, the size or dimensions of a passive balun may increase proportional to the largest operating frequency wavelength and can be prohibitively large for an intended application. For example, the size of a passive balun may be around one quarter of the operating frequency wavelength. However, the size of the linear redriver depicted in FIG. 3 is independent of the wavelength of operating frequency. For example, the IC package size of the linear redriver may be fixed (e.g., 2 millimeter by 6 millimeter or other fixed size). Consequently, the linear redriver can be used with phased array antennas or in applications where a fraction of a dB of insertion loss counts. In addition, because of the compact size of the linear redriver, the propagation time delay between the input terminals 320-1, 320-2 and the output terminals 334-1, 334-2 of the linear redriver can be a fraction of the propagation time delay of a typical balun. Consequently, the linear redriver depicted in FIG. 3 can be used in mobile, radar, and beamforming 5G applications that require faster system response. Further, compared to a typical balun, the linear redriver depicted in FIG. 3 has a controllable low power consumption and lower insert loss and/or return loss between the input terminals 320-1, 320-2 and the output terminals 334-1, 334-2, which reduces radiating emissions produced due to, for example, frequency mismatch. In some embodiments, the linear redriver has multiple equalization gain settings, which can be controllable through a serial digital interface or a general-purpose input/output (GPIO) to compensate for signal loss and to reduce or even eliminate the need for additional low noise amplifiers.

Figure 4:
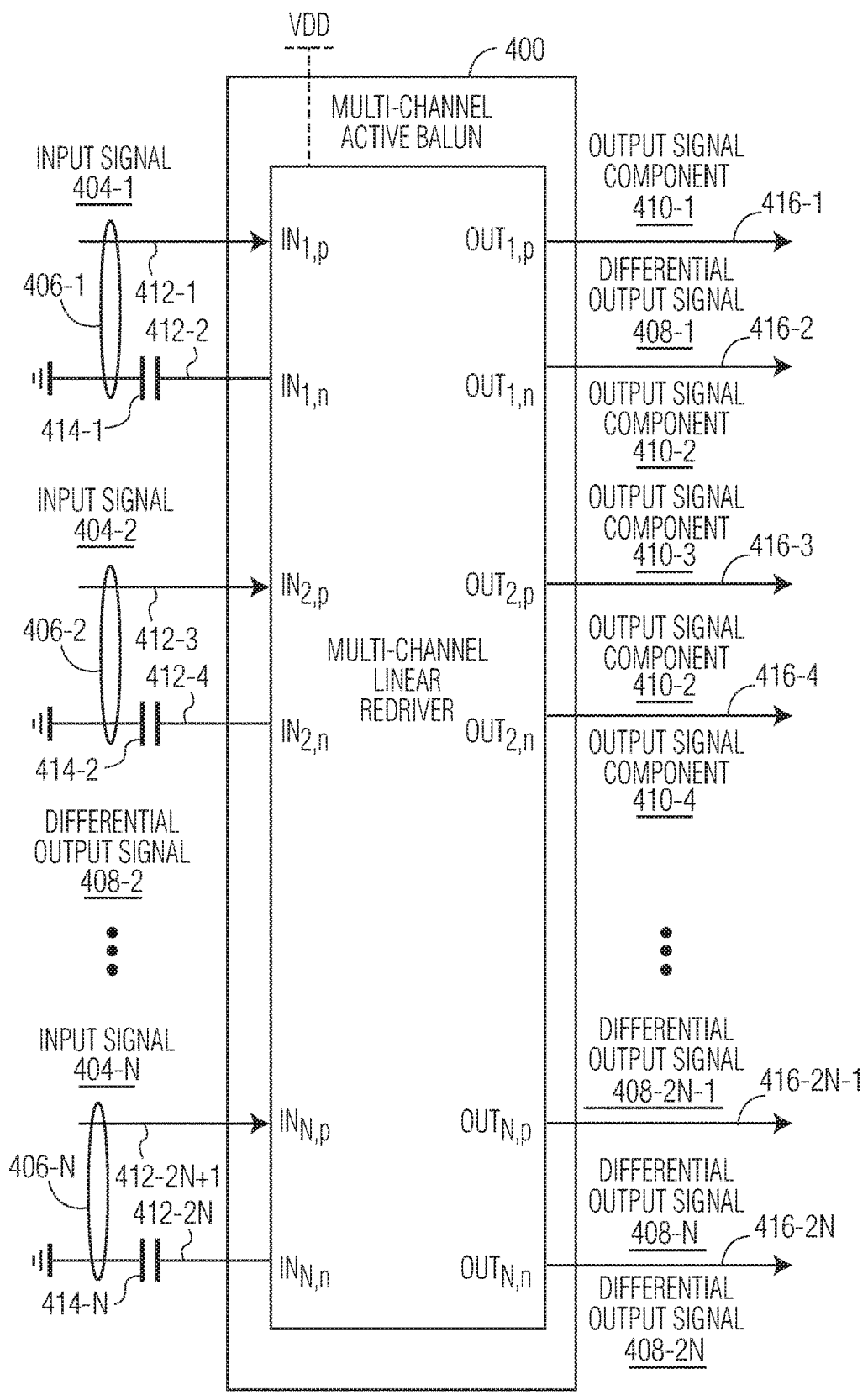
FIG. 4 depicts a multi-channel active balun in accordance with an embodiment of the invention.

In some embodiments, the active balun depicted in FIGS. 1 and 2 have multiple channels whose number can be controlled through a digital interface, which can be seamlessly integrated with phased array antennas for radar and beamforming 5G applications as well as general purpose wideband analog-to-digital converter (ADC) inputs which typically require balanced input signals. FIG. 4 depicts a multi-channel active balun 400 in accordance with an embodiment of the invention. The multi-channel active balun can be used to transform between multiple sets of single-ended signals and multiple sets of differential signals. For example, the multi-channel active balun can be used to transform multiple single-ended signal that is received from an antenna array into multiple differential signals, which can be applied to other multi-channel signal processing components. In the embodiment depicted in FIG. 4, the multi-channel active balun is implemented as a linear redriver 402 that converts or splits single-ended input signals 404-1, 404-2, . . . , 404-N, where N is a positive integer, supplied over two-wire transmission lines 406-1, 406-2, . . . , 406-N into differential output signals 408-1, 408-2, . . . , 408-N having separate output signal components 410-1, 410-2, . . . , 410-2N. Each two-wire transmission line includes one wire 412-1, 412-3, . . . , or 406-2N-1, which carries a corresponding input signal, which is received at a positive input terminal $IN_{1,p}$, $IN_{2,p}$, . . . , or $IN_{N,p}$, of the linear redriver, and another wire 412-2, 412-4, . . . , or 406-2N, that is connected to a corresponding negative input terminal, $IN_{1,n}$, $IN_{2,n}$, . . . , or $IN_{N,n}$, of the linear redriver and to electrical ground through a decoupling capacitor, 414-1, 414-2, . . . , or 414-N. The output signal components 410-1, 410-2, . . . , 410-2N of the differential output signals 408-1, 408-2, . . . , 408-N propagate through output terminals $OUT_{1,p}$, $OUT_{1,p}$, . . . , $OUT_{N,p}$, $OUT_{N,n}$ along separate transmission paths 416-1, 416-2, . . . , 406-2N, respectively, and are equal in power but out of phase by one hundred and eighty degrees. The multi-channel active balun 400 depicted in FIG. 1 can operate under a DC supply voltage, $V_{DD}$, of the linear redriver or other external source of electrical power.

Figure 5:
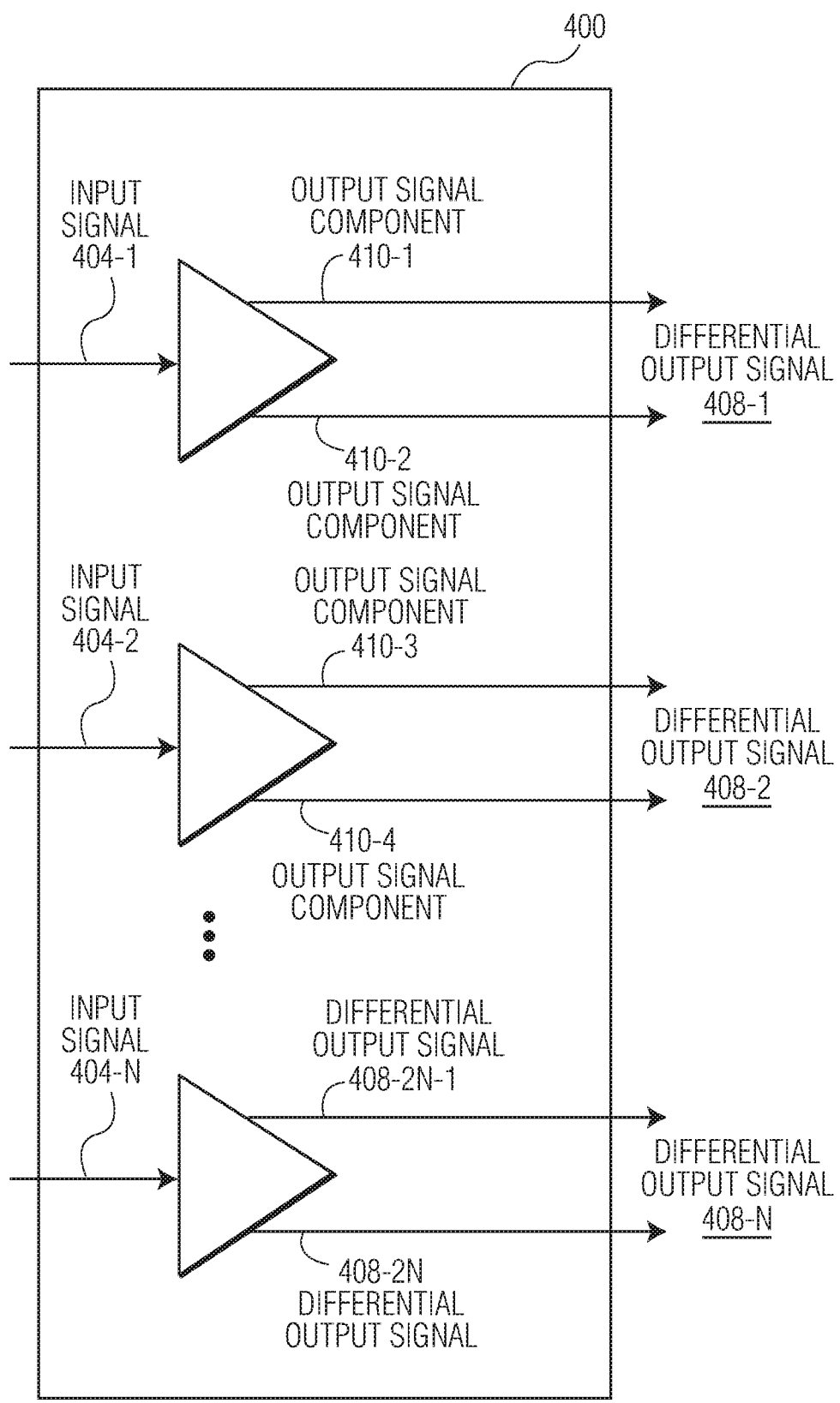
FIG. 5 depicted a simplified diagram of the multi-channel active balun depicted in FIG. 1.

FIG. 5 depicted a simplified diagram of the multi-channel active balun 400 depicted in FIG. 1. In the diagram depicted in FIG. 5, the multi-channel active balun transforms the single-ended input signals 404-1, 404-2, . . . , 404-N into the differential output signals 408-1, 408-2, . . . , 408-N having the separate output signal components 410-1, 410-2, . . . , 410-2N. Compared to a passive balun, the multi-channel active balun depicted in FIGS. 4 and 5 has a smaller size. As input signal frequency decreases toward DC, the size of a passive balun may increase proportional to the largest operating frequency wavelength. For example, the size of a passive balun may be around one quarter of the operating frequency wavelength. However, the size of the multi-channel active balun depicted in FIGS. 4 and 5 is independent of the wavelength of operating frequency. For example, the IC package size of the multi-channel active balun may be fixed (e.g., 2 millimeter by 6 millimeter or other fixed size). Consequently, the active balun depicted in FIGS. 1 and 2 can be used with phased array antennas or in applications where a fraction of a dB of insertion loss counts. In addition, because of the compact size of the linear redriver, the time delay between the input terminals, $IN_p$, $IN_n$, and output terminals of the active balun depicted in FIGS. 1 and 2 can be a fraction of the time delay of a typical balun. Consequently, the active balun depicted in FIGS. 1 and 2 can be used in mobile, radar, and beamforming 5G applications that require faster system response.

Figure 6:
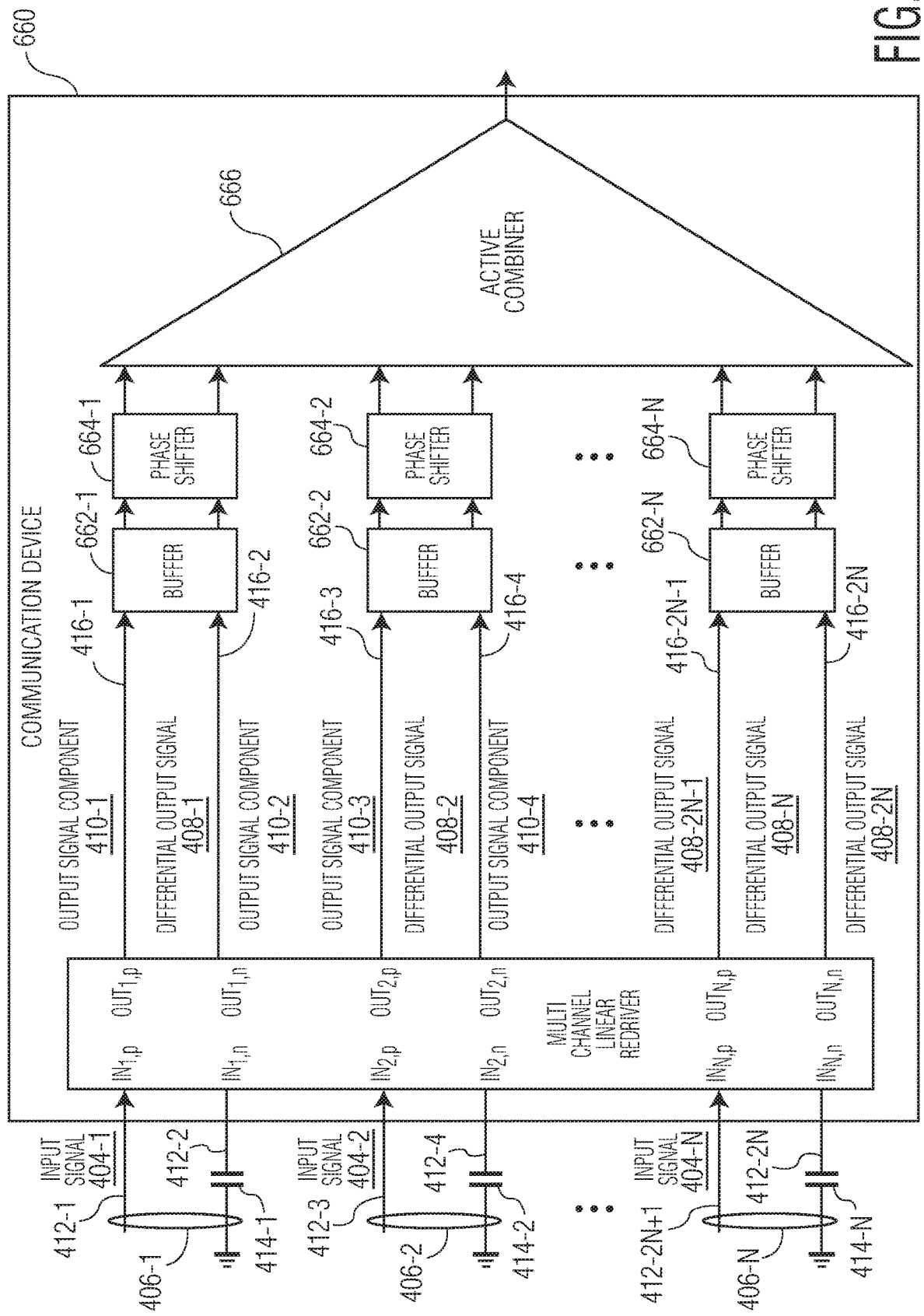
FIG. 6 depicts a communications device that includes the multi-channel active balun depicted in FIG. 4.

FIG. 6 depicts a communications device 660 that includes the multi-channel active balun 400 depicted in FIG. 4. In the embodiment depicted in FIG. 6, the communications device includes the multi-channel active balun, multiple buffers 662-1, 662-2, . . . , 662-N, where N is a positive integer, which are configured to buffer the differential output signals 408-1, 408-2, . . . , 408-N from the multi-channel active balun, multiple phase shifters 664-1, 664-2, . . . , 664-N connected to the buffers, and an active combiner 666 configured to combine output signals from the phase shifters. The communications device 660 depicted in FIG. 6 can be used in various Multiple-input Multiple-output (MIMO) applications, including mobile, radar, and beamforming 5G applications that require faster system response.

Figure 7:
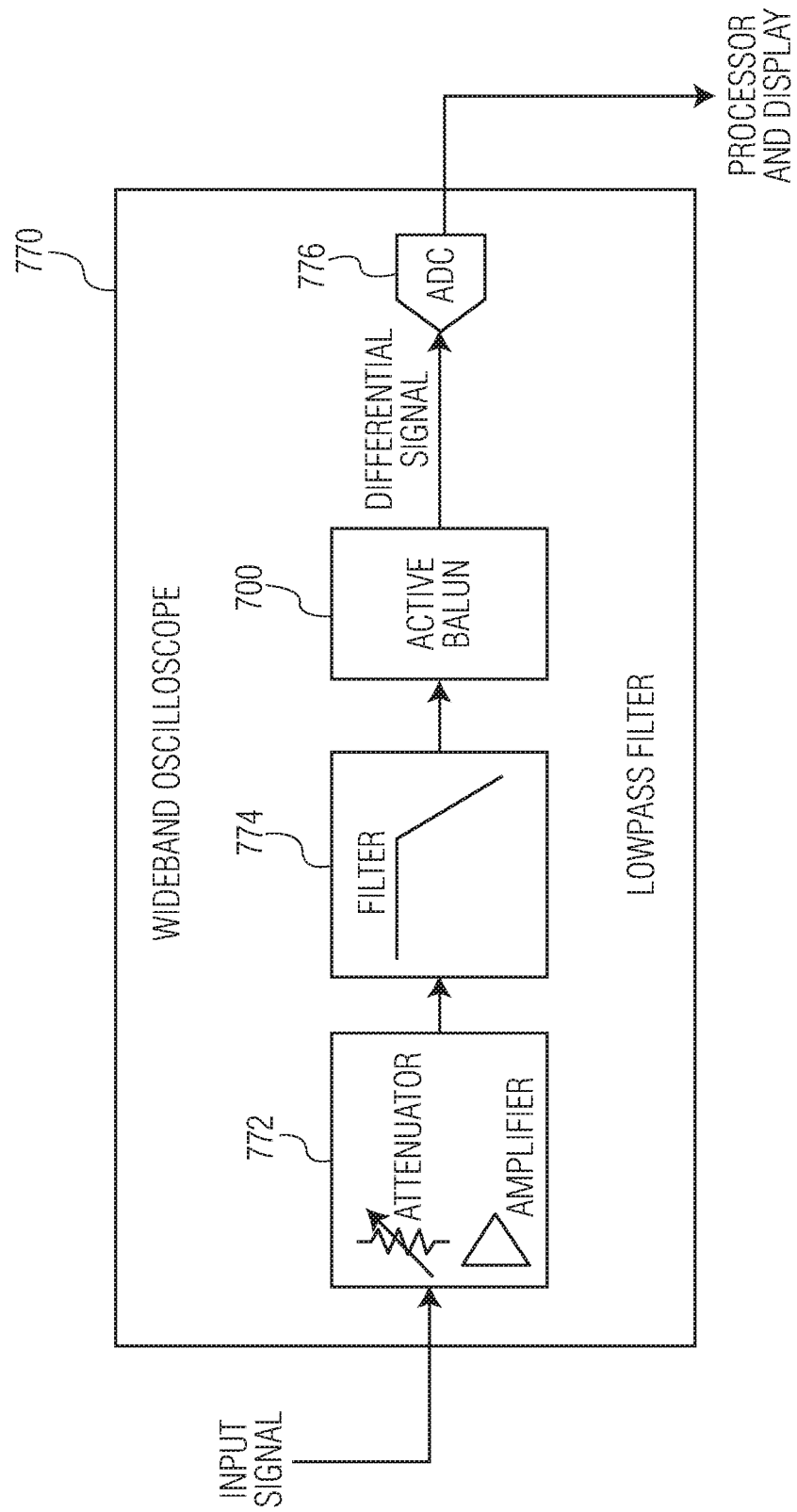
FIG. 7 depicts a wideband oscilloscope that includes an active balun.

In some embodiments, the active balun 100 depicted in FIGS. 1 and 2 and the multi-channel active balun 400 depicted in FIGS. 4 and 5 are used in microwave instruments such as oscilloscopes or spectrum analyzers with single-ended input requiring differential measurements over a wide instantaneous bandwidth. FIG. 7 depicts a wideband oscilloscope 770 that includes an active balun 700. In the embodiment depicted in FIG. 7, the wideband oscilloscope includes a signal processing unit 772 that may include an attenuator or an amplifier, a filter (e.g., a low-pass filter) 774, the active balun 700 that converts single-ended signals into differential signals, and an ADC 776, which uses a pipeline technique that requires differential signal inputs for broadest dynamic range. Although the active balun 700 is shown in FIG. 7 as being located immediately before the ADC 776 in the signal path, the active balun 700 can located in other place in the signal path before the ADC 776. The active balun 700 depicted in FIG. 7 is an embodiment of the active balun 100 depicted in FIG. 1 or the multi-channel active balun 400 depicted in FIG. 4. However, the active balun 100 depicted in FIG. 1 and the multi-channel active balun 400 depicted in FIG. 4 are not limited to the embodiment shown in FIG. 7. The wideband oscilloscope can perform signal digitization from DC to multi-GHz. In the embodiment depicted in FIG. 7, the active balun and the ADC determine the instantaneous bandwidth of the wideband oscilloscope.

The ADC is typically silicon-based and can constantly increase its sample rates. However, a typical passive balun is limited by parasitic and physical size or shape, and generally cannot cope with the bandwidth and accuracy requirement of the ADC. For example, a typical passive balun may use coupled wire (transformer) techniques, which rely on magnetic coupling and therefore are not capable of operating near DC (low frequency). High frequency operation of a typical passive balun is limited by parasitics, construction variations, skin effect, and ferrite properties. In addition, a typical passive balun may use coupled transmission line structures, which rely on electromagnetic coupling between printed conductors, and therefore suffer some of the same limitations as the transformer designs (e.g., parasitics, skin effect, plus substrate dielectric losses that can attenuate substantially a received signal). Compared to a typical passive balun, the active balun 700 can be manufactured in a silicon-based process (e.g., SiGe process where noise is minimal which can achieve a higher signal-to-noise ratio (SNR) than a typical passive balun), and does not have the bandwidth limitations of a passive balun.

Figure 8:
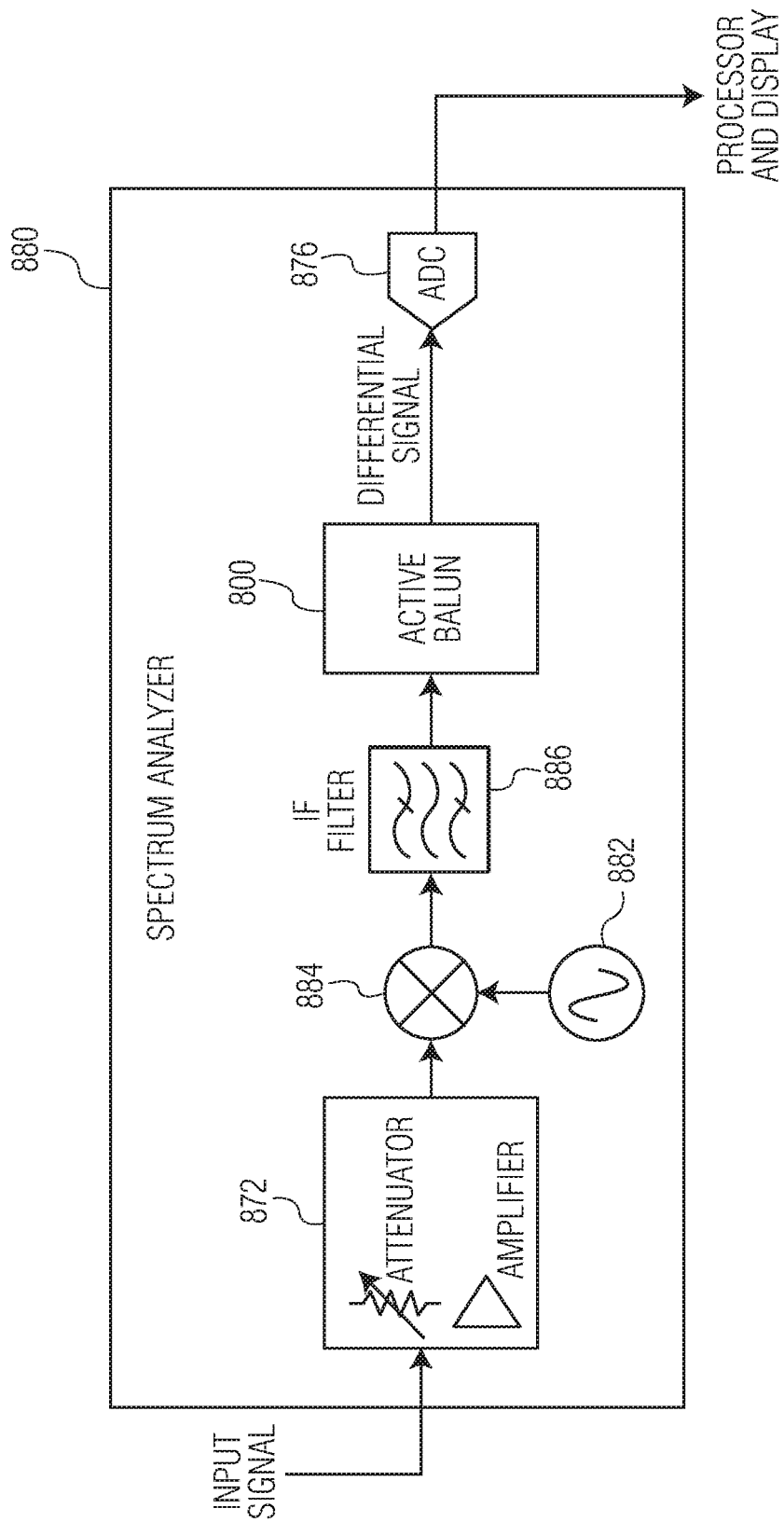
FIG. 8 depicts a spectrum analyzer that includes an active balun.

FIG. 8 depicts a spectrum analyzer 880 that includes an active balun 800. In the embodiment depicted in FIG. 8, the spectrum analyzer includes the active balun 800, a signal processing unit 872 that may include an attenuator or an amplifier, a local oscillator 882, a mixer 884, at least one intermediate frequency (IF) filter 886, the active balun 800 that converts single-ended signals into differential signals, and an ADC 876, which uses a pipeline technique that requires a differential signal input for widest dynamic range. Although the active balun 800 is shown in FIG. 8 as being located immediately before the ADC 876 in the signal path, the active balun 800 can located in other place in the signal path before the ADC 876. The active balun 800 depicted in FIG. 8 is an embodiment of the active balun 100 depicted in FIG. 1 or the multi-channel active balun 400 depicted in FIG. 4. However, the active balun 100 depicted in FIG. 1 and the multi-channel active balun 400 depicted in FIG. 4 are not limited to the embodiment shown in FIG. 8. The spectrum analyzer can perform signal digitization from DC to multi-GHz. In the embodiment depicted in FIG. 8, the balun and the ADC determine the instantaneous bandwidth of the spectrum analyzer. The ADC is typically silicon-based and can constantly increase its sample rates. However, a typical passive balun is limited by parasitic and physical size or shape, and generally cannot cope with the bandwidth and accuracy requirement of the ADC. Compared to a typical passive balun, the active balun 800 can be manufactured in a silicon-based process and does not have the bandwidth limitations of a passive balun.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, electrically erasable programmable read-only memory (EEPROM), a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An active balun, the active balun comprising:
a plurality of input terminals configured to receive a single-ended input signal; and
a linear redriver configured to transform the single-ended input signal into a differential output signal
wherein the linear redriver includes an equalizer circuit configured to perform signal equalization on the single-ended input signal with different gain settings; and
wherein the equalizer circuit includes at least two amplifiers with at least two different gains.

2. The active balun of claim 1, wherein the input terminals comprise:
a first input terminal electrically coupled to a decoupling capacitor that is coupled to ground; and
a second input terminal electrically coupled to an electrical wire that carries the single-ended input signal.

3. The active balun of claim 1,
wherein the equalizer circuit is a Continuous Time Linear Equalizer (CTLE) circuit.

4. The active balun of claim 1,
wherein the differential output signal comprises a plurality of output signal components that have a phase difference of one hundred eighty degrees.

5. The active balun of claim 1,
wherein the size of the active balun is independent of a wavelength of an operating frequency of the active balun.

6. An active balun, the active balun comprising:
a linear redriver configured to transform a single-ended input signal into a differential output signal, wherein the linear redriver comprises:
a plurality of input terminals configured to receive the single-ended input signal;
a Continuous Time Linear Equalizer (CTLE) circuit configured to perform signal equalization on the single-ended input signal;
a transmitter driver configured to generate a driver signal in response to the signal equalization; and a plurality of output terminals configured to output the differential output signal in response to the driver signal.

7. The active balun of claim 6, wherein the input terminals comprise:
a first input terminal electrically connected to a decoupling capacitor that is connected to ground; and
a second input terminal electrically connected to an electrical wire that carries the single-ended input signal.

8. The active balun of claim 6,
wherein the CTLE circuit is further configured to perform the signal equalization on the single-ended input signal with different gain settings.

9. The active balun of claim 6,
wherein the output terminals are electrically connected to a plurality of transmission paths along which a plurality of output signal components of the differential output signal propagate.

10. The active balun of claim 9,
wherein the output signal components of the differential output signal have a phase difference of one hundred eighty degrees.

11. The active balun of claim 6,
wherein the size of the active balun is independent of a wavelength of an operating frequency of the active balun.

12. The active balun of claim 6,
wherein the linear redriver further comprises a receiver termination unit electrically connected to the input terminals and to a supply voltage.

13. The active balun of claim 12,
wherein the linear redriver further comprises an input buffer electrically connected between the receiver termination unit and the CTLE circuit.

14. The active balun of claim 12,
wherein the linear redriver further comprises a transmitter termination unit electrically connected to the output terminals and to the supply voltage.

15. The active balun of claim 12,
wherein the linear redriver further comprises an output buffer connected between the CTLE circuit and the transmitter driver.

16. A multi-channel active balun, the multi-channel active balun comprising:
a plurality of sets of input terminals configured to receive a plurality of single-ended input signals, wherein each of the sets of input terminals comprises:
a first input terminal electrically coupled to a negative input terminal of a multi-channel linear redriver and to a decoupling capacitor that is coupled to ground; and
a second input terminal electrically coupled to a positive input terminal of the multi-channel linear redriver and to an electrical wire that carries one of the single-ended input signals; and
the multi-channel linear redriver configured to transform the single-ended input signals into a plurality of differential output signals;
wherein the multi-channel linear redriver includes,
a Continuous Time Linear Equalizer (CTLE) circuit configured to perform signal equalization on the single-ended input signals with different gain settings;
a transmitter driver configured to generate a driver signal in response to the signal equalization; and
a plurality of output terminals configured to output the differential output signals in response to the driver signal.

17. The multi-channel active balun of claim 16,
wherein each of the differential output signals comprises two output signal components that have a phase difference of one hundred eighty degrees.

18. The multi-channel active balun of claim 16,
wherein the size of the multi-channel active balun is independent of a wavelength of an operating frequency of the multi-channel active balun.

19. The multi-channel active balun of claim 16, wherein the multi-channel linear redriver further comprises:
a receiver termination unit electrically coupled to the sets of input terminals and to a supply voltage; and
a transmitter termination unit electrically coupled to the output terminals and to the supply voltage.

20. The active balun of claim 2:
wherein the first input terminal is also electrically coupled to a negative input terminal of the linear redriver; and
wherein the second input terminal is also electrically coupled to a positive input terminal of the linear redriver.

21. The active balun of claim 1,
wherein the equalizer circuit includes a first amplifier with a low frequency gain and a second amplifier with a peaking gain.

* * * * *